United States Patent
Chen et al.

(10) Patent No.: US 10,078,970 B2
(45) Date of Patent: *Sep. 18, 2018

(54) HARDWARE MANAGEMENT AND RECONSTRUCTION USING VISUAL GRAPHICS

(71) Applicant: International Business Machines Corporation, Armonk, NY (US)

(72) Inventors: An Ding Chen, Shanghai (CN); Timothy G. McNamara, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

This patent is subject to a terminal disclaimer.

(21) Appl. No.: 15/384,415

(22) Filed: Dec. 20, 2016

(65) Prior Publication Data

US 2017/0092149 A1  Mar. 30, 2017

Related U.S. Application Data

(63) Continuation of application No. 15/139,851, filed on Apr. 27, 2016, now Pat. No. 9,569,889, which is a (Continued)

(51) Int. Cl.
*G06F 17/50* (2006.01)
*G09B 19/00* (2006.01)
(Continued)

(52) U.S. Cl.
CPC ....... *G09B 19/003* (2013.01); *G06F 3/04815* (2013.01); *G06T 13/20* (2013.01); *G06T 17/20* (2013.01); *G06T 19/20* (2013.01); *G09B 5/02* (2013.01); *G06T 2200/24* (2013.01); *G06T 2219/2004* (2013.01); *G06T 2219/2016* (2013.01)

(58) Field of Classification Search
CPC ......... G06T 30/20; G06T 13/20; G06F 17/50; G06F 3/04815; G09B 19/003
See application file for complete search history.

(56) References Cited

U.S. PATENT DOCUMENTS 6,044,411 A   3/2000 Berglund et al.
6,427,176 B1  7/2002 Berglund et al.
(Continued)

OTHER PUBLICATIONS

Chen et al., "Hardware Management and Reconstruction Using Visual Graphics", U.S. Appl. No. 15/384,804, filed Dec. 20, 2016, 25 pages.

(Continued)

*Primary Examiner* — Loc Tran
(74) *Attorney, Agent, or Firm* — Gilbert Harmon, Jr.

(57) ABSTRACT

In an approach for updating instructions of machine repairs to a user interface, a processor populates a quantity of machine components used to construct a machine model. A processor receives the machine model constructed from the quantity of machine components. A processor couples the machine model with a set of vital product data. A processor associates a set of instructions for a repair procedure with the machine model and the vital product data file. A processor generates a visual representation of the repair procedure specific to the machine model.

1 Claim, 3 Drawing Sheets

Related U.S. Application Data continuation of application No. 14/576,337, filed on Dec. 19, 2014, now Pat. No. 9,679,411.

(51) Int. Cl.
  *G06T 13/20* (2011.01)
  *G06T 19/20* (2011.01)
  *G06F 3/0481* (2013.01)
  *G06T 17/20* (2006.01)
  *G09B 5/02* (2006.01)

(56) References Cited

U.S. PATENT DOCUMENTS

| | | | |
|---|---|---|---|
| 6,519,552 B1 | 2/2003 | Sampath et al. | |
| 7,983,809 B2 | 7/2011 | Kell et al. | |
| 8,443,301 B1 | 5/2013 | Easterly et al. | |
| 2004/0019534 A1 | 1/2004 | Callahan et al. | |
| 2004/0225390 A1* | 11/2004 | Keller | G06Q 10/06 700/95 |
| 2006/0004766 A1 | 1/2006 | Merkin | |
| 2008/0003845 A1* | 1/2008 | Hong | H05K 1/14 439/67 |
| 2008/0269916 A1 | 10/2008 | Malone et al. | |
| 2014/0146038 A1* | 5/2014 | Kangas | G06T 19/006 345/419 |

OTHER PUBLICATIONS

IBM Appendix P, List of IBM Patent Applications Treated As Related, Filed Herewith, 2 pages.

"IBM zEnterprise z196"; IBM; Printed Sep. 9, 2014; <http://www-03.ibm.com/systems/z/hardware/zenterprise/z196.html>.

"Method and System for Displaying Physical Representation of a Hardware Platform along with Status of Hardware Component through a Graphical User Interface"; IP.com; Published Sep. 9, 2010.

"Where Do I Plug the Cable? Solving the Logical-Physical Slot Numbering Problem", Technology Brief 209A/1296, Compaq; Published Dec. 1996.

Chen et al., "Hardware Management and Reconstruction Using Visual Graphics", U.S. Appl. No. 14/576,337, filed Dec. 19, 2014, 27 pages.

Chen et al., "Hardware Management and Reconstruction Using Visual Graphics", U.S. Appl. No. 15/139,851, filed Apr. 27, 2016, 27 pages.

IBM Appendix P, list of patents or patent applications treated as related, Dec. 19, 2016, 2 pages.

* cited by examiner

HARDWARE MANAGEMENT AND RECONSTRUCTION USING VISUAL GRAPHICS

BACKGROUND OF THE INVENTION

The present invention relates generally to the field of hardware management and reconstruction of hardware using visual graphics and more particularly to a three-dimensional video graphic showing the steps necessary to repair the hardware.

Repair and maintenance of manufacturing and production equipment requires fully equipped, safety-trained operators who are capable of performing a wide range of repairs for a diverse group of machines. Some of the tasks performed by these operators include inspection, disassembly, re-assembly, alignment, measurements, cabling, component repair, milling, turning, boring, and many other procedures to help ensure a machine is operating at optimum performance and safety. Operators need to be well trained in many different skills, and knowledgeable of many machines, brands, and technologies to complete these tasks. Operators may require an educational background in areas such as electronics, mechanics, software, chemicals, and other scientific areas as well have an understanding of the difference between brands and models within the brand's product lines.

Operators frequently use manuals to understand the machines the operators are repairing and/or maintaining. Sometimes a manual contains models of the machines, along with the textual directions. These models can be in the form of 2-dimensional drafts, 3-dimensional models, templates, schematics, or other forms of visual data that can give the operator a better understanding of the machine or component. The models can be of a single component or of a thousand part machine. They can be created on a computer or other computing device and can be from shell models, to solid models including specific material characteristics.

SUMMARY

According to an embodiment of the present invention, a computer program product for updating instructions of machine repairs to a user interface, the computer program product comprising: one or more computer readable storage media and program instructions stored on the one or more computer readable storage media, the program instructions comprising: program instructions to populate, by one or more processors, a quantity of machine components used to construct a machine model; program instructions to receive, by the one or more processors, the machine model constructed from the quantity of machine components; program instructions to couple, by the one or more processors, the machine model with a set of vital product data wherein the set of vital product data is a file associated with a specific machine; program instructions to indicate, by the one or more processors, an alert within the vital product data when a machine registers an error, wherein the machine is represented by the machine model and a component associated with the error is highlighted in a specific color; program instructions to detect, by the one or more processors, a change to the set of vital product data; responsive to detecting the change to the set of vital product data, program instructions to update, by the one or more processors, the quantity of machine components used to construct the machine model; program instructions to associate, by the one or more processors, a set of instructions and an alternate set of instructions for a repair procedure with the machine model and a file associated with the set of vital product data; program instructions to store, by the one or more processors, the set of vital product data in the file and updating the file when the set of vital product data is modified; program instructions to generate, by the one or more processors, a three-dimensional visual representation and an alternate three-dimensional visual representation of the repair procedure, specific to the machine model, based on a set of animation sequences wherein one or more animation sequences are associated with one or more steps of the repair procedure; program instructions to augment, by one or more processors, the three-dimensional visual representation of the repair procedure to allow a user to change graphical perspective based on removing components from the three-dimensional representation obstructing relevant components and zooming in/out to give a better view of the relevant components; and program instructions to present, by one or more processors, a three-dimensional visual representation of the repair procedure specific to the machine model wherein the three-dimensional visual representation can be instructed to stop, rewind and fast forward.

DETAILED DESCRIPTION

Embodiments of the present invention recognize that typical techniques in hardware and software service organizations can contribute to errors while servicing equipment. Examples of these errors include removing the wrong component from a machine, improperly cabling, removing the wrong cable between components in the machine, and machine upgrades and additions (e.g., adding new memory, new processor nodes, and new I/O cards). These types of service related errors can lead to machine outages that severely impact productivity of the machine. Embodiments of the present invention recognize that some service operators may have limited training for a particular machine. Operators may work on many different brands of equipment and may not be familiar with details of the many different machine designs and issues that may arise when components or cabling is drastically different from brand to brand, and machine to machine.

Embodiments of the present invention recognize that errors can be minimized by implementing computer generated instructions that guide an operator in how to perform the repair for the specific machine requiring service. These instructions will be referred to as Repair and Verify (R&V) instructions. The computer generated instructions can also be extended to other service operations, for example, maintenance, upgrades, and manufacturing execution system (MES) additions. The computer generated instructions can also be extended to any devices or machines which currently have R&V instructions or devices or machines which do not have R&V instructions. In embodiments of the present invention, an operator can select a service reference code related to the assignment to be completed, and the operator will be instructed through a graphical representation with detailed steps of what needs to be done. The service reference code is machine specific and assignment specific to reduce the possibility of errors by the operator. In some embodiments, the machine will not give a reference code and the operator has to determine the component that is causing the problem. The operator can select any component in the machine and a set of instructions are shown to the operator on how to remove that component.

Embodiments of the present invention disclose a method, computer program product, and computer system to manage the machine and the repair of any failing components by using interactive graphical illustrations to guide an operator during the R&V process. For each machine and each assignment, there is a service reference code to reduce the possibility of confusion by an operator among various machine brands and models. The interactive graphical instructions will greatly reduce the chances of improper repair jobs, wrong components or cables being removed, or extended periods of downtime due to lack of knowledge of the repair assignment and/or machine.

The present invention will now be described in detail with reference to the Figures.

Figure 1:
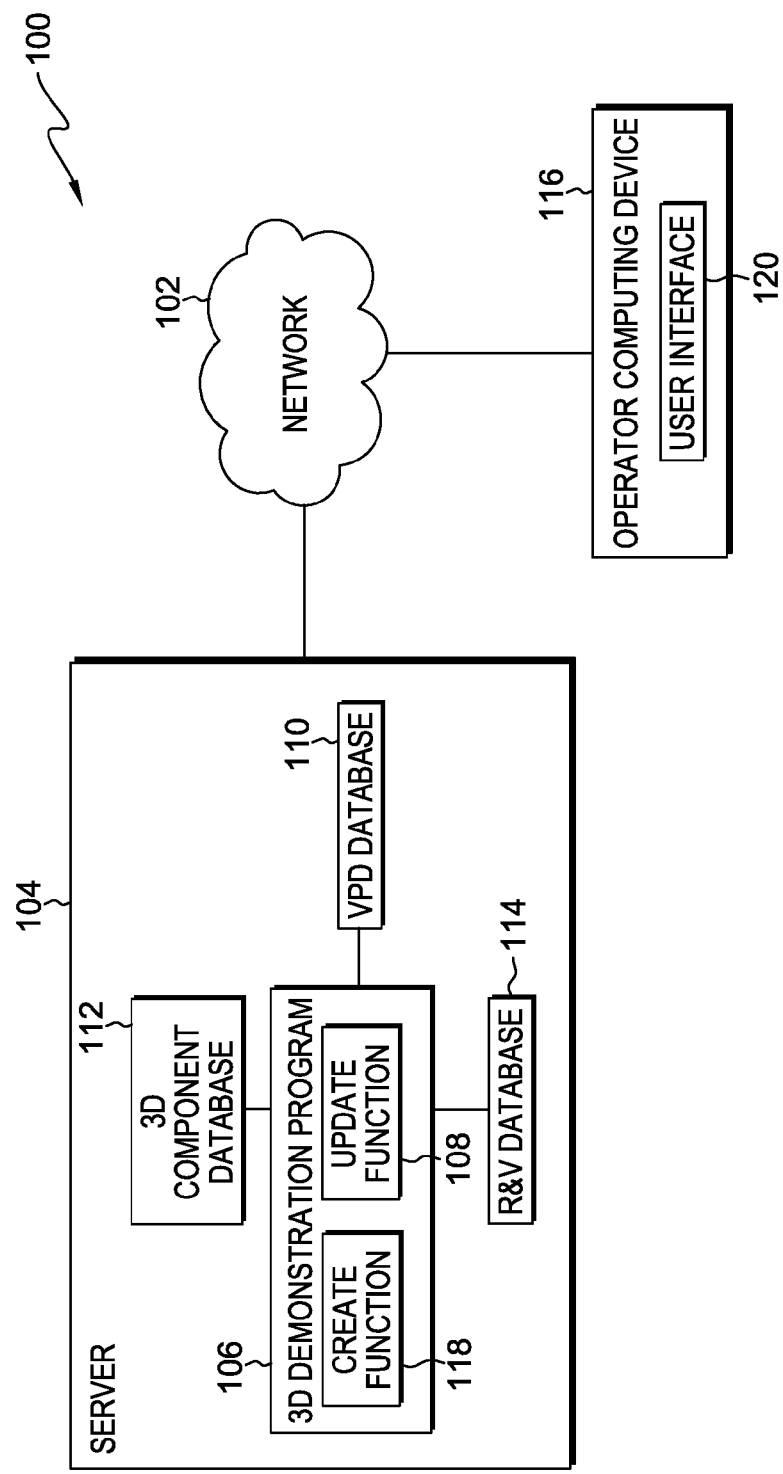
FIG. 1 depicts a block diagram of a computing environment, in accordance with one embodiment of the present invention.

FIG. 1 depicts a block diagram of computing environment 100 in accordance with one embodiment of the present invention. FIG. 1 provides an illustration of one embodiment and does not imply any limitations regarding computing environment 100 in which different embodiments may be implemented. In the depicted embodiment, computing environment 100 includes server 104 and operator computing device 116 interconnected over network 102. Computing environment 100 may include additional computing devices, servers, computers, or other devices not shown.

Network 102 may be a local area network (LAN), a wide area network (WAN) such as the Internet, any combination thereof, or any combination of connections and protocols that will support communications between server 104 and operator computing device 116, in accordance with embodiments of the invention. Network 102 may include wired, wireless, or fiber optic connections.

Server 104 may be a management server, a web server, or any other electronic device or computing system capable of processing program instructions and receiving and sending data. In some embodiments, server 104 may be a laptop computer, tablet computer, netbook computer, personal computer (PC), a desktop computer, or any programmable electronic device capable of communicating with operator computing device 116 via network 102. In other embodiments, server 104 may represent a server computing system utilizing multiple computers as a server system, such as in a cloud computing environment. In another embodiment, server 104 represents a computing system utilizing clustered computers and components to act as a single pool of seamless resources. In the depicted embodiment, server 104 includes 3D demonstration program 106, create function 118, and update function 108, Vital Product Data (VPD) database 110, 3D component database 112, and R&V database 114. Server 104 may include components, as depicted and described in further detail with respect to FIG. 4.

3D demonstration program 106 operates to receive 3D models and R&V instructions to create a machine specific 3D animated instruction video for operators. In one embodiment, an operator requests instructions to update, repair, or perform other work on a machine and 3D demonstration program 106 provides the operator with an animated and annotated set of instructions. In the depicted embodiment, 3D demonstration program 106 communicates with VPD database 110, 3D component database 112, and R&V database 114 and selects data from VPD database 110 and R&V database 114 to create a tutorial or demonstration based on the operator's request. In one embodiment, 3D demonstration program 106 resides on server 104. In another embodiment, 3D demonstration program 106 may be located on another server, or another computing device, provided that 3D demonstration program 106 is accessible to operator computing device 116, and provided that 3D demonstration program 106 has access to VPD database 110, 3D component database 112, and R&V database 114.

Create function 118 operates to build and animate an animation, as per a request received by 3D demonstration program 106. Create function 118 creates an animation that can be provided to an operator at operator computing device 116. Create function 118 receives a request and builds a 3D model, inputs R&V instructions, and animates the 3D model to illustrate to the operator the steps necessary to perform the repairs or maintenance on the machine. In one embodiment, create function 118 uses information from VPD database 110, 3D component database 112, and R&V database 114 to build an initial 3D model with the R&V instructions. In other embodiments, create function 118, retrieves an already constructed 3D model and inserts the R&V instructions.

Update function 108 operates to update the file that 3D demonstration program 106 is requested to update. Update function 108 updates a file included in VPD database 110 when a machine component is upgraded, removed, downgraded, or altered and the machine specific VPD file is responsive to the alterations and needs to be modified to show these changes so that the machine specific VPD file is a proper representation of the current machine build. Update function 108 acts to receive data from 3D component library 110, VPD database 110, and R&V database 114 to update the machine builds and R&V instructions. As machines are built and modified, many machines of the same machine type may have different modifications performed to the machine as new technology becomes available, as the machine's purpose shifts, or as any quantity of reasons cause a machine to be modified.

In one embodiment, a business with several machines of the same machine type may have maintenance performed on these machines at different times, and for different reasons. The maintenance, or other factors may cause each of the machines to be different from one another. Update function 108 allows each machine to have individualized instructions based on the components of the machine. In one embodiment, 3D demonstration program 106 receives a request for a modification by an operator at operator computing device 116 or by another operator at another computer device (not shown) indicating an update request in response to, for example, a machine having been modified. 3D demonstration program 106 locates the machine specific VPD file in VPD database 110 and updates the file according to the request 3D demonstration program 106 received. 3D demonstration program 106 receives the request and update the VPD file, the associated R&V instructions included in R&V database 114, and the 3D component(s) from 3D component database 112 that construct the machine model. When an operator goes to perform maintenance or modifications to that machine 3D demonstration program 106 will incorporate the most accurate and up-to-date model and set of instructions. Updated information may come from operator computing device 116, another computer device, or an external device.

VPD database 110 may be a repository that may be written to and/or read by 3D demonstration program 106, create function 118, and update function 108. Information gathered from 3D component database 112 and R&V database 114 may be stored in VPD database 110. Such information may include VPD files. Examples of information in the VPD file include, but are not limited to, machine location, part numbers, serial numbers, Custom Card Identification Number (CCIN), manufacture, brand, machine location, machine type, machine model, and any other information specific to a machine. In another embodiment, VPD file can include any amount of different pieces of information related to a single or a plurality of machines. The VPD file is created concurrently with the 3D model and are linked together so any modifications made to the VPD file or the 3D model will result in the other file being updated to reflect the changes. VPD files are capable of being updated as machines are updated, modified, repaired, or have any other work performed on the machines resulting in a change to a single component or many components. In one embodiment, VPD files are updated by the operator or from a third party prior to the work being performed on the machine. In the depicted embodiments, VPD database 110 resides on server 104. In other embodiments, VPD database 110 may reside on another server, or another computing device, provided that 3D component database 112 is accessible to 3D demonstration program 106.

3D component database 112 may be a repository that may be written to and/or read by 3D demonstration program 106, create function 118, and update function 108. Information gathered from but not limited to other databases, 3D modeling programs, or third parties may be stored to 3D component database 112. Such information may include but not limited to 3D models, 3D software, 3D components of 3D models, machine photos, and other necessary information related to the construction of 3D models of machines. In one embodiment, 3D component database 112 is modifiable by a user to add, remove, edit, and change data included within the database. In the depicted embodiments, 3D component database 112 resides on server 104. In other embodiments, 3D component database 112 may reside on another server, or another computing device, provided that 3D component database 112 is accessible to 3D demonstration program 106.

R&V database 114 may be a repository that may be written to and/or read by 3D demonstration program 106, create function 118, and update function 108. Information gathered from the R&V instructions may be stored on R&V database 114. Such information may include the current R&V instructions used for machine repair and maintenance, past R&V instructions, and future R&V instructions created. R&V instructions are textual documents that may or may not include images giving a step by step procedure to perform specific tasks on different machines. The R&V instructions give a detailed description of each step of the procedure specific to the machine that the textual document was created for. In the depicted embodiments, 3D component database 112 resides on server 104. In other embodiments, 3D component database 112 may reside on another server, or another computing device, provided that 3D component database 112 is to 3D demonstration program 106.

Operator computing device 116 may be a desktop computer, laptop computer, tablet computer, netbook computer, personal computer (PC), a desktop computer, mobile device, or any programmable electronic device capable of communicating via network 102. In other embodiments, operator computing device 116 may be any electronic device or computing system capable of sending and receiving data, and communicating with server 104 via network 102.

User interface 120 operates on operator computing device 116 to generate display signals corresponding to content, such as windows, menus, icons, 3D models, R&V instructions, VPD file information, and to receive various forms of user input. In one embodiment, user interface 120 comprises an interface to 3D demonstration program 106, create function 118, and/or update function 108. User interface 120 may send input to 3D demonstration program 106, create function 118, and/or update function 108. User interface 120 may comprise one or more interfaces such as an operating system interface and/or application interfaces.

Figure 2:
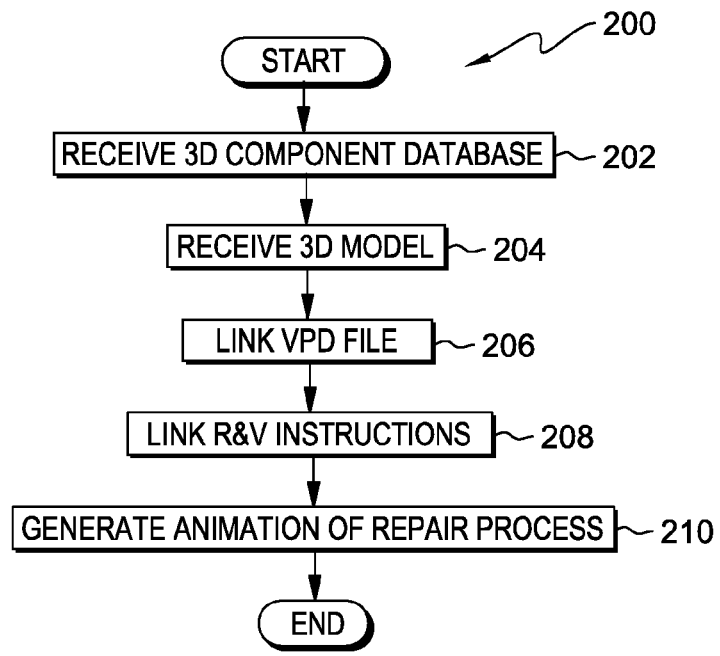
FIG. 2 is a flowchart depicting operational steps of an update function for creating a tutorial executing within the computing environment of FIG. 1, in accordance with one embodiment of the present invention.

FIG. 2 depicts flowchart 200 of create function 118, a function of 3D demonstration program 106 executing within computing environment 100 of FIG. 1, in accordance with an embodiment of the present invention. Create function 118 typically operates when a machine is first designed, a machine is being built for the first time in a 3D environment, or for other reasons that would necessitate an initial build of a machine in a 3D environment. 3D demonstration program 106 receives necessary models, VPD files, and R&V instructions and creates a visual representation of how to perform the work on a machine.

In step 202, create function 118 receives a 3D component database, such as 3D component database 112. 3D component database 112 is used to build the complete 3D versions of each machine. In one embodiment, a set of R&V instructions is linked with each 3D component, to allow a more detailed set of instructions to the operator of how to remove or repair each individual 3D component when work is to be performed on a machine. The 3D components in 3D component database 112 are of each individual component that is necessary to build the virtual 3D model of the machine. In one embodiment, the 3D component database 112 is already populated with components to build the machines. In other embodiments, the 3D component database 112 is populated by a third party, by 3D designers who create each component as they are needed for virtual machine builds. In some embodiments, the 3D components are created in .3ds, .blend, .dxf, or other file formats that is currently used or could be used in the future to create 3D models.

In step 204, create function 118 receives a 3D model of the machine. The 3D model represents a complete build of a machine. In some embodiments, a 3D designer, a third party, or a program constructs the 3D model of the machine and the 3D model is added to 3D component database 112. In other embodiments, create function 118 constructs the 3D model of the machine when the machine is first turned on. Create function 118 receives the machines information at the initial startup, compares the machine information to the VPD file for the machine, and builds a 3D model of the machine. In one embodiment, once the VPD file is created for a machine, create function 118 uses the part list that is contained within the VPD file and construct a 3D model of the machine. In another embodiment, once the VPD file is created for a machine, create function 118 will alert a third party to build the 3D model of the machine. In one embodiment, the 3D model of the machine is stored in 3D component database 112. In other embodiments, the 3D model of the machine is stored in a quantity of databases on a quantity of servers, provided 3D demonstration program 106 has access to the 3D models and provided the 3D models are accessible by create function 118.

In step 206, create function 118 links a Vital Product Data (VPD) file. A VPD file is a collection of configuration and informational data associated with a particular set of hardware or software. VPD stores information such as part numbers, serial numbers, and engineering change levels. In one embodiment, the VPD file is stored within VPD database 110. In other embodiments, the VPD file is stored in another database providing, 3D demonstration program 106 can access the VPD file. In one embodiment, each VPD file requires a unique file name. In some embodiments, the VPD file is a .doc, .docx, .xml, or other similar file that is capable of being manipulated by an operator. In one embodiment, the VPD file includes information about the machine, for example machine type, machine serial number, machine model, machine name, machine number, part numbers, serial number and any other information related to the machine and/or components of the machine. In some embodiments, the VPD file may be created by an operator, 3D designer, or anyone capable of creating the file. In one embodiment, the VPD file is created simultaneously with the 3D model. In other embodiments, the VPD file is created before, or after the creation of the 3D model and the VPD file and the 3D model is linked together by a third operational step (not shown).

In step 208, create function 118 links the R&V instructions into the VPD file. R&V instructions are the step by step directions to perform certain repairs and verifications on a machine. Examples of R&V instructions include step by step directions to remove different components (hard drives, I/O cards), steps to replace different components, update components, perform annual maintenance on machine components, component verification, and other necessary repairs that are needed to be done to the machines. In one embodiment, the R&V instructions are text only files. In other embodiments, the R&V files may include textual data, visual data, or a combination of both. Visual data can be in the form of photographs of the parts, 3D rendered models of the components or machines, or other forms of visual graphics.

In one embodiment, create function 118 links the R&V instructions to the VPD file of the machine that the instructions are used on. Create function 118 receives the machine serial numbers, part numbers, CCIN, or component numbers of the machine and the components of the machine and links the machine serial numbers, part numbers, CCIN, or component numbers of the machine and the components of the machine from the R&V instructions. The result is the R&V instructions are now linked to the VPD file, when a modification or repair is performed on a machine the operator will have instructions relating to the components that need to be removed. In other embodiments, the operator is permitted to access other repair procedures if other work needs to be done to the machine. In one embodiment, the VPD file is updated automatically when components are replaced within the machine. In another embodiment, the VPD file is updated by the operator or a third party anytime they are informed of changes that happen to the machine. In other embodiments, the machine will be connected to 3D demonstration program 106 via a network 102 and when the machine reports an error it will update the VPD file to show the components that need replacing or repairing. In another embodiment, the R&V files are created for each component that is stored in 3D model database 106. In such an embodiment, 3D demonstration program 106 links each R&V instruction set to each 3D component, such that in the VPD file if any repairs or verifications need to be performed on the machine, each and every component associated with the repair or verification incorporates a set of R&V instructions.

In step 210, create function 118 creates an animation of the removal and installation process for the relevant components of the machine. In one embodiment, the animation will be created by the VPD file informing create function 118 of all the components that are related to the issue, and within a set of predefined parameters create function 118 will create an animation by exploding the affected components within the confines of the constraints used to construct the 3D model. In other embodiments, the animations are created by a $3^{rd}$ party and stored in a database and are incorporated into the VPD file for the machine. The current R&V instructions may or may not have an associated image to give a visual representation of the work that needs to be completed. In one embodiment, create function 118 receives the VPD file, 3D model, and R&V instructions and create a 3-Dimensional animated video of the removal and installation process for each component that is to be affected by the change in the VPD file. The 3D animated video includes the textual R&V instructions with the animation to give a complete set of directions. The R&V instructions are presented to the operator at operator computing device 116. In other embodiments, the operator is presented with a combination of textual, video, and images to give a complete set of instructions to complete the task at the operator computing device 116. In some embodiments, the operator is able to augment the graphical perspective, for example zoom in, zoom out, rotate, highlight, cut away part of the machine, remove components that are obstructing the relevant components to the task, and perform other options to give a better view of the components so that task can be completed without any errors. In one embodiment, the operator is able to stop, rewind, and fast forward the sequence of animations.

Figure 3:
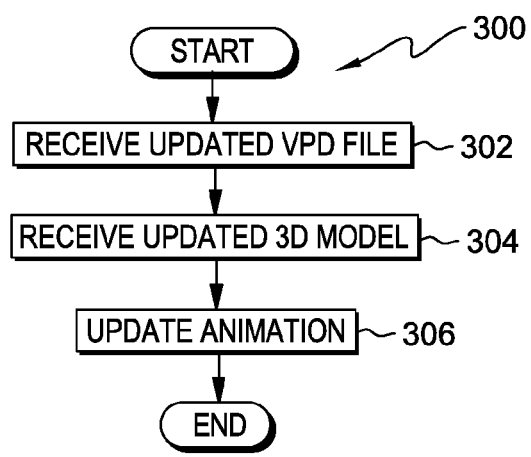
FIG. 3 is a flowchart depicting operational steps of an update function for updating a tutorial executing within the computing environment of FIG. 1, in accordance with one embodiment of the present invention.

FIG. 3 depicts flowchart 300 of update function 108, a function of 3D demonstration program 106 executing within computing environment 100 of FIG. 1, in accordance with an embodiment of the present invention. Updated function 108 operates to update a VPD file and all corresponding files and tutorials that are linked to the VPD file.

In step 302, update function 108 receives an updated a VPD file. Update function 108 may update a VPD file before, during, or after the machine is updated or modified after the initial build of the VPD file. An operator documents any updates or repairs that are performed on each machine in the corresponding VPD file so that the most current machine build is accessible to the operators. In one embodiment, the machine and 3D demonstration program 106 are connected to network 102, and responsive to when the machine registers an error, or a failure, update function 108 receives these updates and update the VPD file. In another embodiment, update function 108 receives the updates from the machine and will request an operator to verify and confirm that the updates are accurate.

In step 304, update function 108 receives an updated 3D model associated with the VPD file. Update function 108 highlights the component that is causing the error so that the VPD file reflects the service or maintenance actions performed by the operator on the machine. In one embodiment, update function 108 removes the component and replaces it with an updated component highlighted in a specific color. In some embodiments, update function 108 accesses the 3D components and rebuilds the machine, or replaces the components that have been updated or modified. In one embodiment, update function 108 receives the updated VPD file and requests approval from a third party to confirm the modifications are accurate. In one embodiment, update function 108 receives the updated VPD file and informs a third party to update the corresponding 3D model.

In step 306, update function 108 updates the animation of the repair process for the machine. Each 3D component may incorporate an associated set of R&V instructions. The 3D model incorporates the necessary components, and each component incorporates the associated R&V instructions. These elements may be linked through the VPD file. When update function 108 is presented with an update to a machine, update function 108 updates the VPD file, which results in an update of the 3D model and a reassignment of R&V instructions for the new machine build. These new R&V instructions are paired with the updated demonstration animation that update function 108 created regarding the components in the VPD file that were updated. Reducing the chance of an inaccurate or incomplete set of instructions being shown to the operator.

Figure 4:
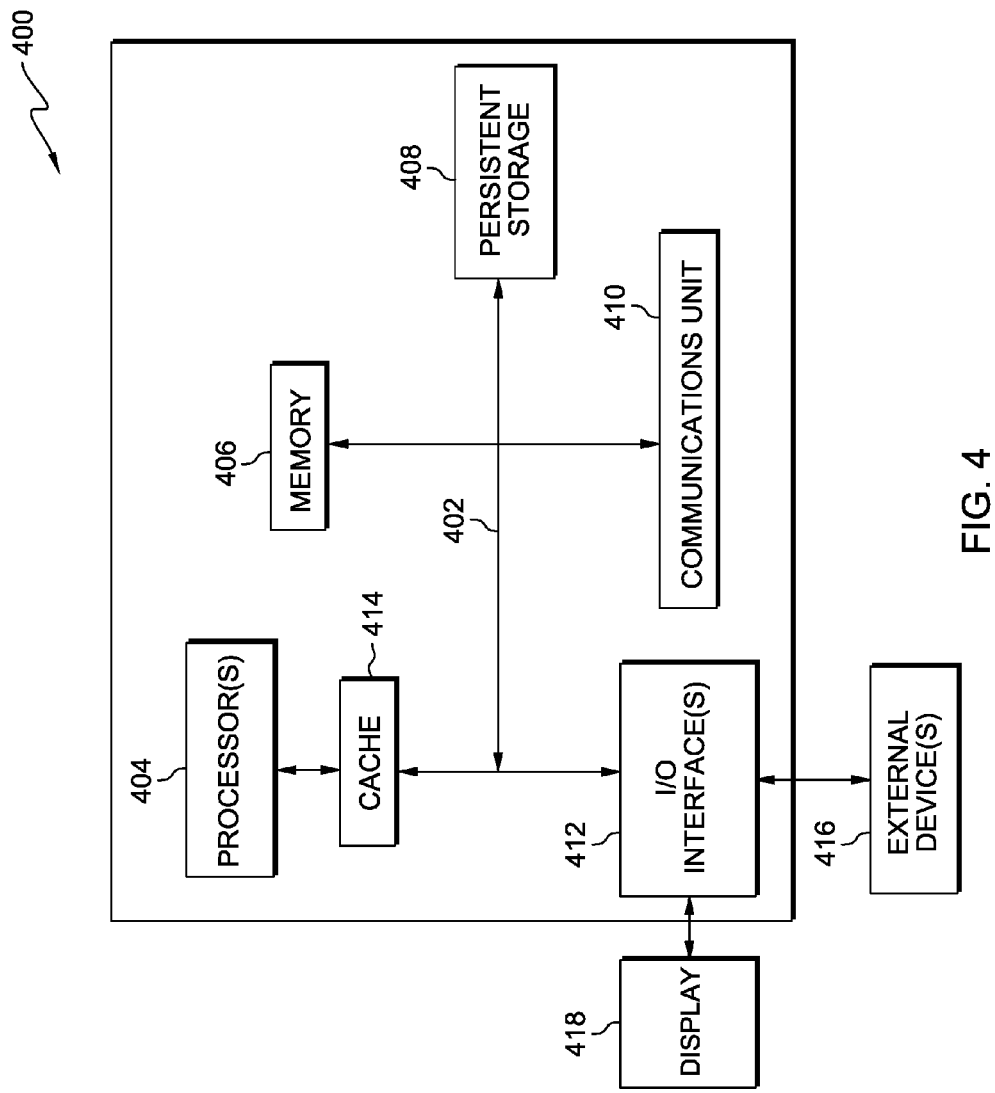
FIG. 4 is a block diagram of internal and external components of the operator computing device and server of FIG. 1, in accordance with one embodiment of the present invention.

FIG. 4 depicts a block diagram 400 of components of server 104, in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Server 104 include communications fabric 402, which provides communications between computer processor(s) 404, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In one embodiment, memory 406 includes random access memory (RAM) and cache memory 414. In general, memory 406 can include any suitable volatile or non-volatile computer-readable storage media.

HPDP 104, VRH database 106 and SML database 108 are stored for execution by one or more of the respective computer processors 404 of server 104 via one or more memories of memory 406 of server 104. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer-readable storage medium that is also part of persistent storage 408.

Communications unit 410, in the examples, provides for communications with other data processing systems or devices, including server 104. In the examples, communications unit 410 includes one or more network interface cards. Communications unit 410 may provide communications through the use of either or both physical and wireless communications links. HPDP 104 may be downloaded to persistent storage 408 of server 104 through communications unit 410 of server 104.

I/O interface(s) 412 allows for input and output of data with other devices that may be connected to server 104. For example, I/O interface 412 may provide a connection to external devices 416 such as a keyboard, keypad, camera, a touch screen, and/or some other suitable input device. External devices 416 can also include portable computer-readable storage media such as, for example, thumb drives, portable optical or magnetic disks, and memory cards. Software and data used to practice embodiments of the present invention, e.g., function of HPDP 104 can be stored on such portable computer-readable storage media and can be loaded onto persistent storage 408 of server 104 via I/O interface(s) 412 of server 104. Software and data used to practice embodiments of the present invention, e.g., HPDP 104 can be stored on such portable computer-readable storage media and can be loaded onto persistent storage 408 of server 104 via I/O interface(s) 412 of server 104. I/O interface(s) 412 also connect to a display 418.

Display 418 provides a mechanism to display data to a user and may be, for example, a computer monitor.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer program product for updating instructions of machine repairs to a user interface, the computer program product comprising:
one or more non-transitory computer readable storage media and program instructions stored on the one or more non-transitory computer readable storage media, the program instructions comprising:
program instructions to populate, by one or more processors, a quantity of machine components used to construct a machine model;
program instructions to receive, by the one or more processors, the machine model constructed from the quantity of machine components;
program instructions to couple, by the one or more processors, the machine model with a set of vital product data wherein the set of vital product data is a file associated with a specific machine;
program instructions to indicate, by the one or more processors, an alert within the vital product data when a machine registers an error, wherein the machine is represented by the machine model and a component associated with the error is highlighted in a specific color;
program instructions to detect, by the one or more processors, a change to the set of vital product data;
responsive to detecting the change to the set of vital product data, program instructions to update, by the one or more processors, the quantity of machine components used to construct the machine model;
program instructions to associate, by the one or more processors, a set of instructions and an alternate set of instructions for a repair procedure with the machine model and a file associated with the set of vital product data;
program instructions to store, by the one or more processors, the set of vital product data in the file and updating the file when the set of vital product data is modified;
program instructions to generate, by the one or more processors, a three-dimensional visual representation and an alternate three-dimensional visual representation of the repair procedure, specific to the machine model, based on a set of animation sequences wherein one or more animation sequences are associated with one or more steps of the repair procedure;
program instructions to augment, by one or more processors, the three-dimensional visual representation of the repair procedure to allow a user to change graphical perspective based on the user removing components from the three-dimensional representation obstructing relevant components and wherein the user instructs the three-dimensional visual representation to zoom in/out to give a better view of the relevant components; and program instructions to present, by one or more processors, a three-dimensional visual representation of the repair procedure specific to the machine model wherein the user instructs the three-dimensional visual representation to stop, rewind and fast forward.

* * * * *